(12) United States Patent
Yoshimoto et al.

(10) Patent No.: US 7,844,923 B2
(45) Date of Patent: Nov. 30, 2010

(54) SEMICONDUCTOR INTEGRATED CIRCUIT DESIGNING METHOD, SEMICONDUCTOR INTEGRATED CIRCUIT DEVICE, AND ELECTRONIC DEVICE

(75) Inventors: Yutaka Yoshimoto, Shiga (JP); Minoru Ito, Shiga (JP)

(73) Assignee: Panasonic Corporation, Osaka (JP)

( * ) Notice: Subject to any disclaimer, the term of this patent is extended or adjusted under 35 U.S.C. 154(b) by 479 days.

(21) Appl. No.: 11/907,997

(22) Filed: Oct. 19, 2007

(65) Prior Publication Data

US 2008/0098342 A1 Apr. 24, 2008

(30) Foreign Application Priority Data

Oct. 20, 2006 (JP) .............................. 2006-285809

(51) Int. Cl.
*G06F 17/50* (2006.01)
(52) U.S. Cl. .............................................. 716/1; 716/2
(58) Field of Classification Search ...................... 716/1, 716/2, 18
See application file for complete search history.

(56) References Cited

U.S. PATENT DOCUMENTS

| 6,477,654 | B1 | 11/2002 | Dean et al. | |
| 7,458,052 | B1 * | 11/2008 | Chandra et al. | 716/10 |
| 2003/0208725 | A1 * | 11/2003 | Shibata et al. | 716/1 |
| 2005/0091629 | A1 * | 4/2005 | Eisenstadt et al. | 716/13 |

FOREIGN PATENT DOCUMENTS

| JP | 2003-218210 | 7/2003 |
| JP | 2005-039334 | 2/2005 |

OTHER PUBLICATIONS

Min, Kyeong-Sik et al., "Zigzag Super Cut-off CMOS (ZSCCMOS) Block Activation with Self-Adaptive Voltage Level Controller: An Alternative to Clock-Gating Scheme in Leakage Dominant Era," ISSCC, Session 22, Paper 22.8, University of Tokyo, 2003, IEEE Tokyo, Japan.

* cited by examiner

*Primary Examiner*—Jack Chiang
*Assistant Examiner*—Binh C Tat
(74) *Attorney, Agent, or Firm*—McDermott Will & Emery LLP

(57) ABSTRACT

A simple method for designing a semiconductor integrated circuit having the ZSCCMOS structure is provided. For each kind of primitive logic gate, a logic gate cell H and a layout cell H each having a high-potential power supply end connected to $V_{DD}$ and a low potential power supply end connected to a pseudo-power supply line $V_{SSV}$, and a logic gate cell L and a layout cell L each having a high-potential power supply end connected to a pseudo-power supply line $V_{DDV}$ and a low potential power supply end connected to $V_{SS}$, are prepared. Logic simulation is performed on the assumption of a state immediately before power cut-off using a net list. The logic gate cell H is used as a primitive logic gate having an output state of "H" and the logic gate cell L is used as a primitive logic gate having an output state of "L", thereby changing the net list. A layout is generated using the layout cells H and L.

18 Claims, 14 Drawing Sheets

FIG. 2A 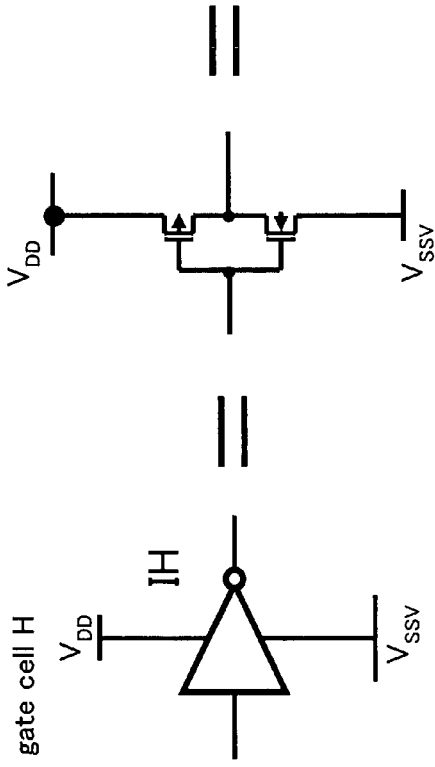 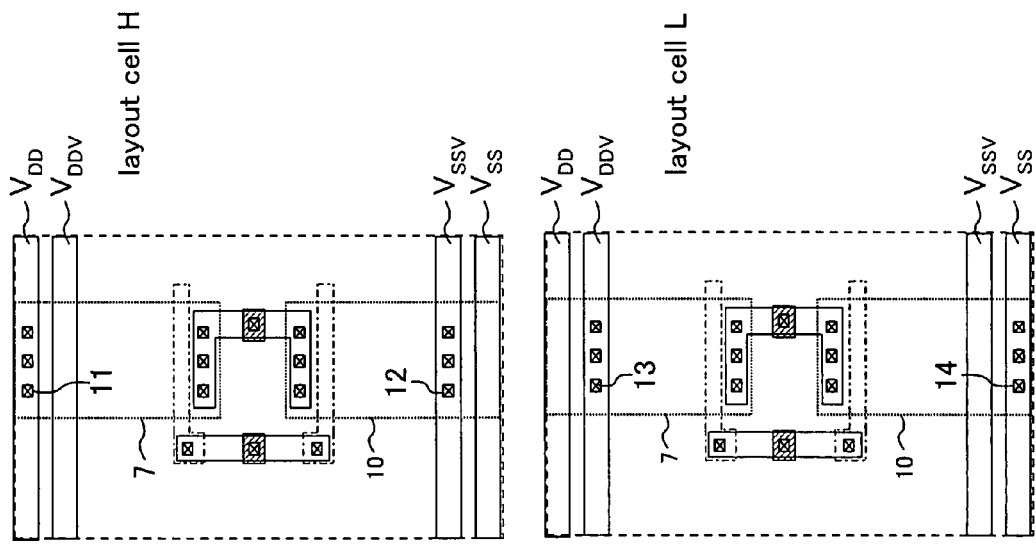
FIG. 2B 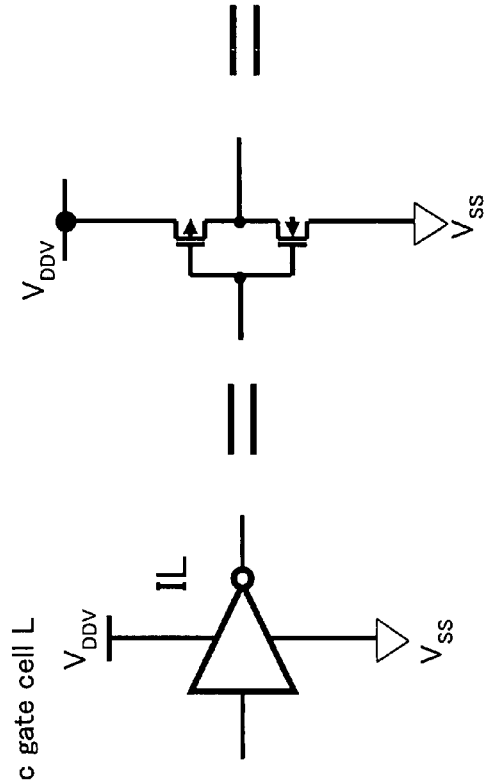 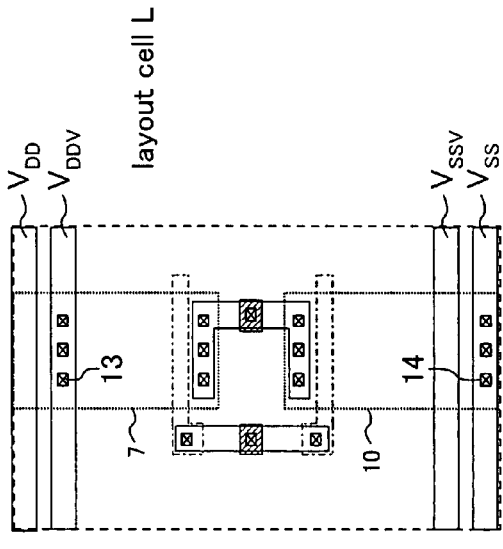

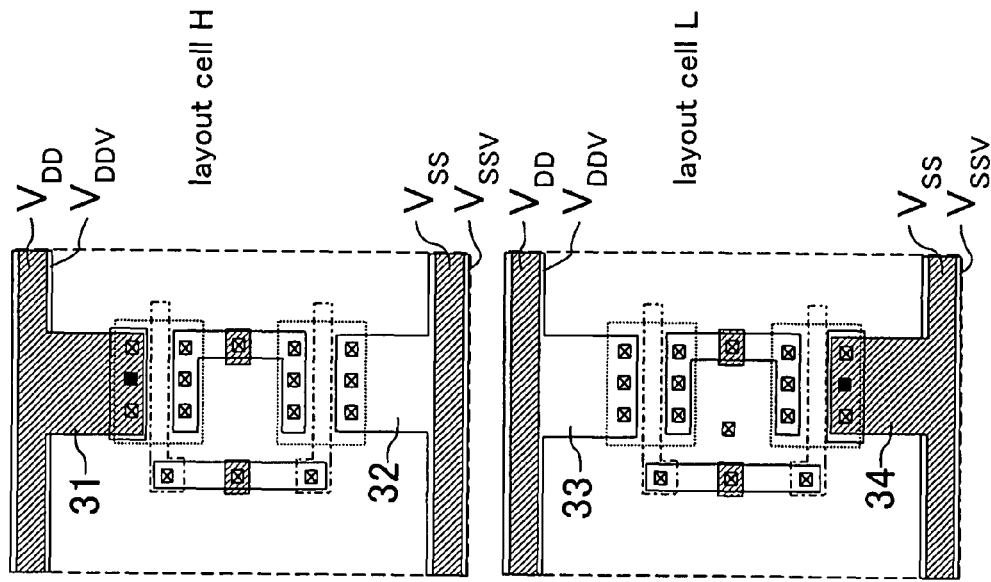
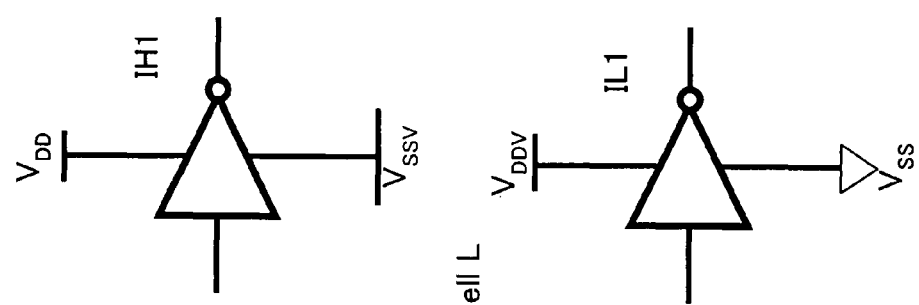
FIG. 11A
FIG. 11B

SEMICONDUCTOR INTEGRATED CIRCUIT DESIGNING METHOD, SEMICONDUCTOR INTEGRATED CIRCUIT DEVICE, AND ELECTRONIC DEVICE

CROSS REFERENCE TO RELATED APPLICATIONS

This Non-provisional application claims priority under 35 U.S.C. §119(a) on Patent Application No. 2006-285809 filed in Japan on Oct. 20, 2006, the entire contents of which are hereby incorporated by reference.

BACKGROUND OF THE INVENTION

1. Field of the Invention

The present invention relates to a method for designing a semiconductor integrated circuit having a power control transistor and configured to achieve a power control for low power consumption.

2. Description of the Related Art

Conventionally, as a method for achieving low power consumption of a semiconductor integrated circuit, there is a known method which employs a zigzag super cut-off CMOS circuit (ZSCCMOS) or a zigzag boosted gate MOS circuit (ZBGMOS).

FIG. 14 shows a configuration of the ZSCCMOS circuit. The ZSCCMOS circuit has a combinational circuit 50 for which power is cut off. In the combinational circuit 50, a logic gate circuit which outputs "L" immediately before power cut-off has a high-potential power supply end connected to a pseudo-power supply line $V_{DDV}$ connected via a power control transistor MP to a high potential power supply line $V_{DD}$, and a low potential power supply end connected to a low potential power supply line $V_{SS}$. Also, a logic gate circuit which outputs "H" immediately before power cut-off has a high-potential power supply end connected to the high potential power supply line $V_{DD}$, and a low potential power supply end connected to another pseudo-power supply line $V_{SSV}$ connected via a power control transistor MN to the low potential power supply line $V_{SS}$.

With the circuit configuration, the gate-drain breakdown voltage of the power control transistor can be suppressed to a low value, and the state recovery time of the combinational circuit 50 during recovery of power can be reduced (see Japanese Unexamined Patent Application Publication No. 2005-39334 and Kyeong-sik Min et al., "Zigzag Super Cut-off CMOS (ZSCCMOS) Block Activation with Self-Adaptive Voltage Level Controller: An Alternative to Clock-Gating Scheme in Leakage Dominant Era", 2003 IEEE International Solid-State Circuits Conference, session 22, TD: Embedded Technologies, Paper 22.8).

However, semiconductor integrated circuits employing the above-described low power consumption circuit technique have the following problem.

A net list which is generated in a logic design stage does not have information about connection of the high-potential power supply end or low potential power supply end of each primitive logic gate in a circuit for which power is to be cut off. Therefore, the layout of the semiconductor integrated circuit employing the low power consumption circuit technique cannot be designed directly from the net list.

Also, in the semiconductor integrated circuit employing the low power consumption circuit technique, even the same primitive logic gate has different connection destinations of the high-potential power supply end and the low potential power supply end, depending on whether the output state during power cut-off is "H" or "L". Therefore, during layout design, wiring of the power supply ends cannot be automatically achieved using currently commonly used layout cells and layout tools. Also, when the wiring of the power supply ends is manually performed, it takes a very long time, which is impractical.

Note that, as a method for designing a layout for providing multiple power supplies, Japanese Unexamined Patent Application Publication No. 2003-218210 discloses a layout designing method for arranging layout cells, where an internal power supply is electrically separated from a main line power supply, and selectively wiring power supplies in a wiring step. However, this method requires a special process in the wiring step, and therefore, when the number of logic gates to be laid out is huge, a very long processing time is disadvantageously required.

SUMMARY OF THE INVENTION

In view of the above-described problems, the present invention has been achieved. An object of the present invention is to provide a simple design method for describing a semiconductor integrated circuit having the ZSCCMOS structure.

In the present invention, two kinds of cells are prepared which have a common function and different wirings at power supply ends, logic simulation is performed on the assumption of power cut-off, and based on the result, a cell is selected to generate a layout.

Specifically, a first aspect of the present invention is directed to a method for designing a semiconductor integrated circuit comprising a high potential power supply line, a low potential power supply line, a first pseudo-power supply line connected to the high potential power supply line via a first power control transistor, and a second pseudo-power supply line connected to the low potential power supply line via a second power control transistor. The method comprises a first step of preparing a first logic gate cell and a first layout cell each having a high-potential power supply end connected to the high potential power supply line and a low potential power supply end connected to the second pseudo-power supply line, and a second logic gate cell and a second layout cell each having a high-potential power supply end connected to the first pseudo-power supply line and a low potential power supply end connected to the low potential power supply line, for each kind of primitive logic gate, a second step of performing logic simulation on the assumption of a state immediately before power cut-off using a net list representing a logic circuit to be designed, and based on a result of the simulation, determining an output state of each primitive logic gate included in the logic circuit, a third step of changing the net list by using the first logic gate cell for a primitive logic gate having an output state of "H" and the second logic gate cell for a primitive logic gate having an output state of "L" based on the output state of each primitive logic gate determined in the second step, and a fourth step of generating a layout by using the first layout cell for the first logic gate cell and the second layout cell for the second logic gate cell based on the net list changed in the third step.

According to the first aspect of the present invention, a first logic gate cell and a first layout cell each having a high-potential power supply end connected to the high potential power supply line and a low potential power supply end connected to the second pseudo-power supply line, and a second logic gate cell and a second layout cell each having a high-potential power supply end connected to the first pseudo-power supply line and a low potential power supply end connected to the low potential power supply line, are prepared for each kind of primitive logic gate. Logic simulation is performed on the assumption of a state immediately before power cut-off using a net list representing a logic circuit to be designed, and based on a result of the simulation, an output state of each primitive logic gate included in the logic circuit is determined. The net list is changed by using the first logic gate cell for a primitive logic gate having an output state of "H" and the second logic gate cell for a primitive logic gate having an output state of "L". A layout is generated by using the first layout cell for the first logic gate cell and the second layout cell for the second logic gate cell based on the changed net list. Thereby, a layout of a semiconductor integrated circuit employing the ZSCCMOS circuit can be generated by such an easy method.

A second aspect of the present invention is directed to a method for designing a semiconductor integrated circuit comprising a high potential power supply line, a low potential power supply line, a first pseudo-power supply line connected to the high potential power supply line via a first power control transistor, and a second pseudo-power supply line connected to the low potential power supply line via a second power control transistor. The method comprises a first step of preparing a first layout cell having a high-potential power supply end connected to the high potential power supply line and a low potential power supply end connected to the second pseudo-power supply line, and a second layout cell having a high-potential power supply end connected to the first pseudo-power supply line and a low potential power supply end connected to the low potential power supply line, for each kind of primitive logic gate, a second step of performing logic simulation on the assumption of a state immediately before power cut-off using a net list representing a logic circuit to be designed, and based on a result of the simulation, determining an output state of each primitive logic gate included in the logic circuit, a third step of generating a layout by using the first layout cell for a primitive logic cell having an output state of "H" and the second layout cell for a primitive logic cell having an output state of "L" based on the output state of each primitive logic gate determined in the second step.

According to the second aspect of the present invention, a first layout cell having a high-potential power supply end connected to the high potential power supply line and a low potential power supply end connected to the second pseudo-power supply line, and a second layout cell having a high-potential power supply end connected to the first pseudo-power supply line and a low potential power supply end connected to the low potential power supply line, are prepared for each kind of primitive logic gate. Logic simulation is performed on the assumption of a state immediately before power cut-off using a net list representing a logic circuit to be designed, and based on a result of the simulation, an output state of each primitive logic gate included in the logic circuit is determined. A layout is generated by using the first layout cell for a primitive logic cell having an output state of "H" and the second layout cell for a primitive logic cell having an output state of "L". Thereby, a layout of a semiconductor integrated circuit employing the ZSCCMOS circuit can be generated by such an easy method.

In the first or second aspect of the present invention, in the second step, the logic simulation is preferably performed while each input to the logic circuit is fixed to "H" or "L".

Also, in the first or second aspect of the present invention, the first and second layout cells of the same kind of primitive logic gates preferably have a common layout of a transistor section. In the first layout cell, a diffusion layer or a metal wiring extending from the high-potential power supply end is preferably connected via a via to the high potential power supply line, while a diffusion layer or a metal wiring extending from the low potential power supply end is preferably connected via a via to the second pseudo-power supply line. In the second layout cell, a diffusion layer or a metal wiring extending from the high-potential power supply end is preferably connected via a via to the first pseudo-power supply line, while a diffusion layer or a metal wiring extending from the low potential power supply end is preferably connected via a via to the low potential power supply line.

Also, in the first or second aspect of the present invention, at least one first layout cell preferably includes a power control transistor provided between the second pseudo-power supply line and the low potential power supply line, and at least one second layout cell preferably includes a power control transistor provided between the first pseudo-power supply line and the high potential power supply line.

Also, in the first or second aspect of the present invention, in each of the first and second layout cells, the high potential power supply line and the first pseudo-power supply line preferably overlap each other, and the low potential power supply line and the second pseudo-power supply line preferably overlap each other.

A third aspect of the present invention is directed to a semiconductor integrated circuit device comprising a high potential power supply line and a low potential power supply line, a first pseudo-power supply line connected to the high potential power supply line via a first power control transistor, a second pseudo-power supply line connected to the low potential power supply line via a second power control transistor, and a first cell and a second cell having a transistor section having a common layout. In the first cell, a diffusion layer or a metal wiring extending from a high-potential power supply end thereof is connected via a via to the high potential power supply line, while a diffusion layer or a metal wiring extending from a low potential power supply end thereof is connected via a via to the second pseudo-power supply line. In the second cell, a diffusion layer or a metal wiring extending from a high-potential power supply end thereof is connected via a via to the first pseudo-power supply line, while a diffusion layer or a metal wiring extending from a low potential power supply end thereof is connected via a via to the low potential power supply line.

In the third aspect of the present invention, the first cell preferably has a power control transistor provided between the second pseudo-power supply line and the low potential power supply line, and the second cell preferably has a power control transistor provided between the first pseudo-power supply line and the high potential power supply line.

Also, in the third aspect of the present invention, the high potential power supply line and the first pseudo-power supply line preferably overlap each other, and the low potential power supply line and the second pseudo-power supply line preferably overlap each other.

Also, in the third aspect of the present invention, the first and second power control transistors preferably have a threshold voltage whose absolute value is smaller than or equal to the absolute value of a threshold voltage of a transistor included in the first and second cells.

Also, in the third aspect of the present invention, the first and second power control transistors are preferably of the depletion type.

Also, in the third aspect of the present invention, the first and second power control transistors are preferably formed on a silicon substrate having the SOI (Silicon on Insulator) structure.

Also, in the third aspect of the present invention, each transistor included in the first and second cells is preferably formed on a silicon substrate having the SOI (Silicon on Insulator) structure.

A fourth aspect of the present invention is directed to an electronic device comprising the semiconductor integrated circuit device of the third aspect of the present invention, and a power supply device for supplying power to the semiconductor integrated circuit device.

According to the present invention, automatic layout design of a semiconductor integrated circuit having a power control transistor can be easily achieved and the number of steps in design can be significantly reduced.

BRIEF DESCRIPTION OF THE DRAWINGS

FIGS. 2A and 2B are diagrams showing an example of logic gate cells H and L and layout cells H and L according to Embodiment 1 of the present invention.

FIGS. 11A and 11B are diagrams showing an example of logic gate cells H and L and layout cells H and L according to Embodiment 4 of the present invention.

DETAILED DESCRIPTION OF THE PREFERRED EMBODIMENTS

Hereinafter, embodiments of the present invention will be described with reference to the accompanying drawings. Note that, in the following description, a MOS (Metal Oxide Semiconductor) transistor is assumed to be used, which is a representative example of MIS (Metal Insulated Semiconductor) transistors.

Embodiment 1

Figure 1:
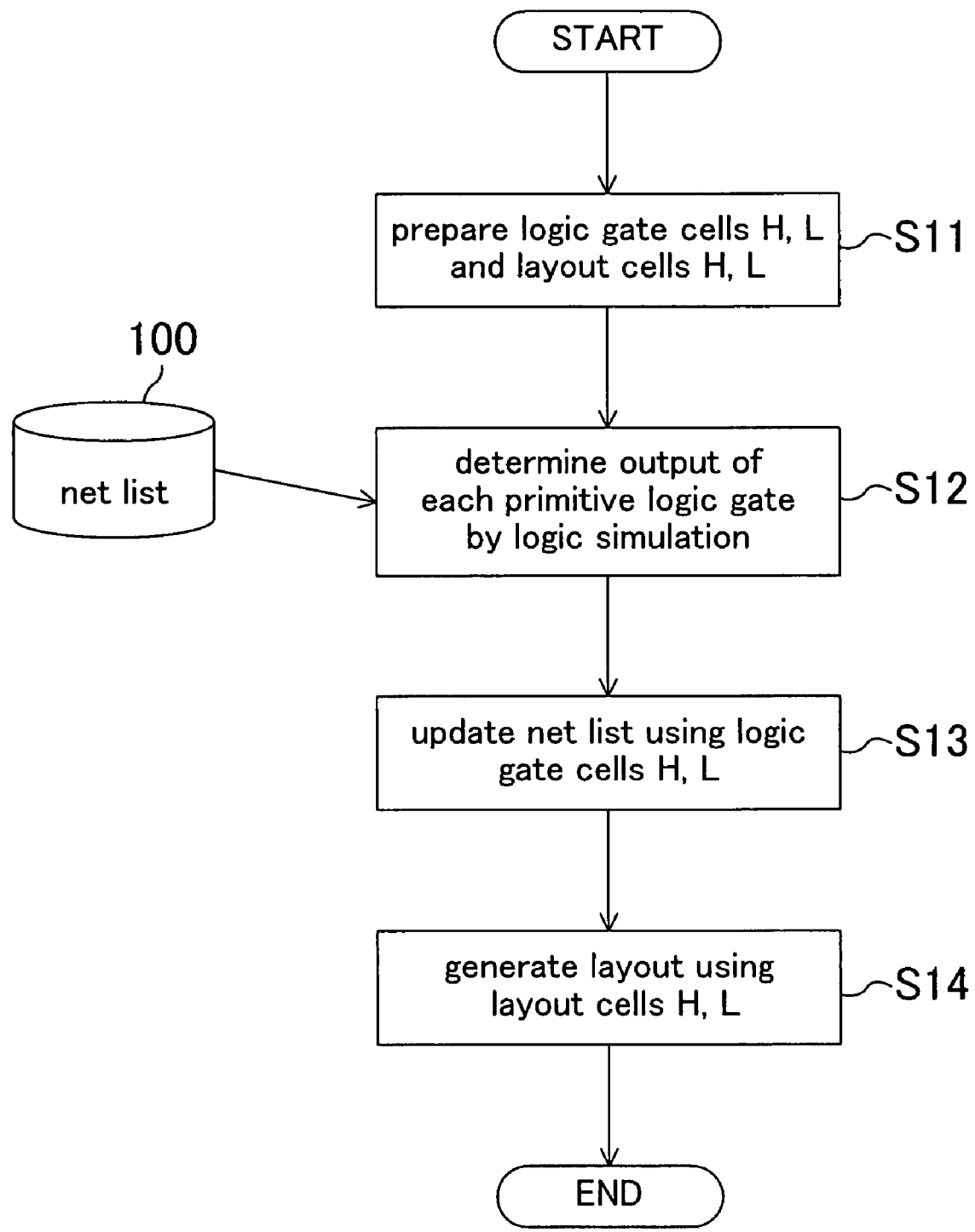
FIG. 1 is a flowchart showing a semiconductor integrated circuit designing method according to Embodiment 1 of the present invention.

FIG. 1 is a flowchart showing a semiconductor integrated circuit designing method according to Embodiment 1 of the present invention. The semiconductor integrated circuit designing method of this embodiment will be described with reference to FIG. 1.

Initially, in a first step S11, for each kind of primitive logic gate, two kinds of logic gate cells (i.e., a logic gate cell H as a first logic gate cell and a logic gate cell L as a second logic gate cell) and two kinds of layout cells (i.e., a layout cell H as a first layout cell and a layout cell L as a second layout cell) are prepared. These logic gate cells H and L and layout cells H and L are, for example, stored in a database.

In the logic gate cell H and the layout cell H, the high-potential power supply end of the primitive logic gate is connected to a high potential power supply line $V_{DD}$, and the low potential power supply end is connected to a second pseudo-power supply line $V_{SSV}$ connected via a power control transistor to a low potential power supply line $V_{SS}$. On the other hand, in the logic gate cell L and the layout cell L, the high-potential power supply end is connected to a first pseudo-power supply line $V_{DDV}$ connected via a power control transistor to the high potential power supply line $V_{DD}$, and the low potential power supply end is connected to the low potential power supply line $V_{SS}$.

Here, the term "primitive logic gate" refers to a logic gate which is a basic component of a logic, such as an inverter, a NAND, or NOR.

FIGS. 2A and 2B are diagrams showing an example the logic gate cells H and L and the layout cells H and L, where an inverter is illustrated as the primitive logic gate. FIG. 2A shows the logic gate cell H and the layout cell H, and FIG. 2B shows the logic gate cell L and the layout cell L. Note that, in FIGS. 2A and 2B, squares including a cross represent vias (contacts) connecting a diffusion layer and a first metal wiring layer. The same applies to other layout diagrams.

As shown in FIG. 2A, in the logic gate cell H (IH), which is an inverter, the high-potential power supply end is connected to the high potential power supply line $V_{DD}$, and the low potential power supply end is connected to the second pseudo-power supply line $V_{SSV}$. In the layout cell H, the high potential power supply line $V_{DD}$, the first pseudo-power supply line $V_{DDV}$, the low potential power supply line $V_{SS}$, and second pseudo-power supply line $V_{SSV}$ are formed of metal wirings in the same layer. A diffusion layer 7 extending from the high-potential power supply end is connected via a via 11 to the high potential power supply line $V_{DD}$, and a diffusion layer 10 extending from the low potential power supply end is connected via a via 12 to the second pseudo-power supply line $V_{SSV}$.

As shown in FIG. 2B, in the logic gate cell L (IL), which is an inverter, the high-potential power supply end is connected to the first pseudo-power supply line $V_{DDV}$, and the low potential power supply end is connected to the low potential power supply line $V_{SS}$. In the layout cell L, the high potential power supply line $V_{DD}$, the first pseudo-power supply line $V_{DDV}$, the low potential power supply line $V_{SS}$, and the second pseudo-power supply line $V_{SSV}$ are formed of metal wirings in the same layer. The diffusion layer 7 extending from the high-potential power supply end is connected via a via 13 to the first pseudo-power supply line $V_{DDV}$, and the diffusion layer 10 extending from the low potential power supply end is connected via a via 14 to the low potential power supply line $V_{SS}$. In other words, the layout cell H and the layout cell L have the same layout of a transistor section in which transistors are provided, except for the positions of the vias provided in the diffusion layers 7 and 10.

Figures 3A, 3B:
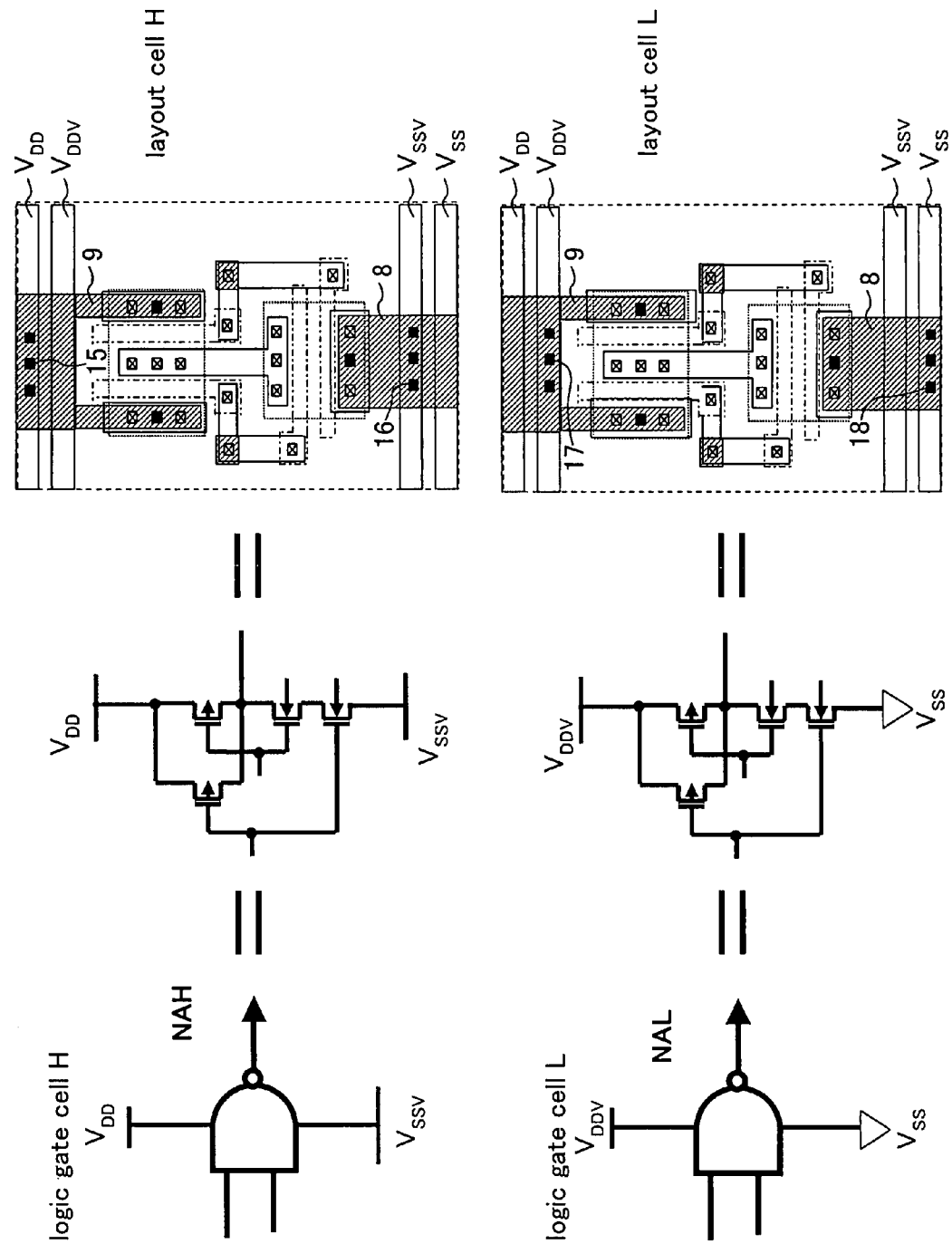
FIGS. 3A and 3B are diagrams showing another example of logic gate cells H and L and layout cells H and L according to Embodiment 1 of the present invention.

FIGS. 3A and 3B are diagram showing another example of the logic gate cells H and L and the layout cells H and L, where a NAND gate is illustrated as the primitive logic gate.

FIG. 3A shows the logic gate cell H and the layout cell H, and FIG. 3B shows the logic gate cell L and the layout cell L. Note that, in FIGS. 3A and 3B, closed squares represent vias connecting a first metal wiring layer and a second metal wiring layer. The same applies to other layout diagrams.

As shown in FIG. 3A, in the logic gate cell H (NAH), which is a NAND gate, the high-potential power supply end is connected to the high potential power supply line $V_{DD}$, and the low potential power supply end is connected to the second pseudo-power supply line $V_{SSV}$. In the layout cell H, the high potential power supply line $V_{DD}$, the first pseudo-power supply line $V_{DDV}$, the low potential power supply line $V_{SS}$, and the second pseudo-power supply line $V_{SSV}$ are formed of metal wirings in the same layer. A metal wiring 9 extending from the high-potential power supply end is connected a via 15 to the high potential power supply line $V_{DD}$, and a metal wiring 8 extending from the low potential power supply end is connected via a via 16 to the second pseudo-power supply line $V_{SSV}$.

As shown in FIG. 3B, in the logic gate cell L (NAL), which is a NAND gate, the high-potential power supply end is connected to the first pseudo-power supply line $V_{DDV}$, and the low potential power supply end is connected to the low potential power supply line $V_{SS}$. In the layout cell L, the high potential power supply line $V_{DD}$, the first pseudo-power supply line $V_{DDV}$, the low potential power supply line $V_{SS}$, and the second pseudo-power supply line $V_{SSV}$ are formed of metal wirings in the same layer. The metal wiring 9 extending from the high-potential power supply end is connected via a via 17 to the first pseudo-power supply line $V_{DDV}$, and the metal wiring 8 extending from the low potential power supply end is connected via a via 18 to the low potential power supply line $V_{SS}$. In other words, the layout cell H and the layout cell L have the same layout of a transistor section in which transistors are provided, except for the positions of the vias provided in the metal wirings 9 and 8.

Next, in a second step S12, logical simulation is performed on the assumption of a state immediately before power cut-off using a net list 100 which represents a logic circuit to be designed. Based on the result of the simulation, an output state of each primitive logic gate included in the logic circuit represented by the net list 100 is determined.

Figure 4:
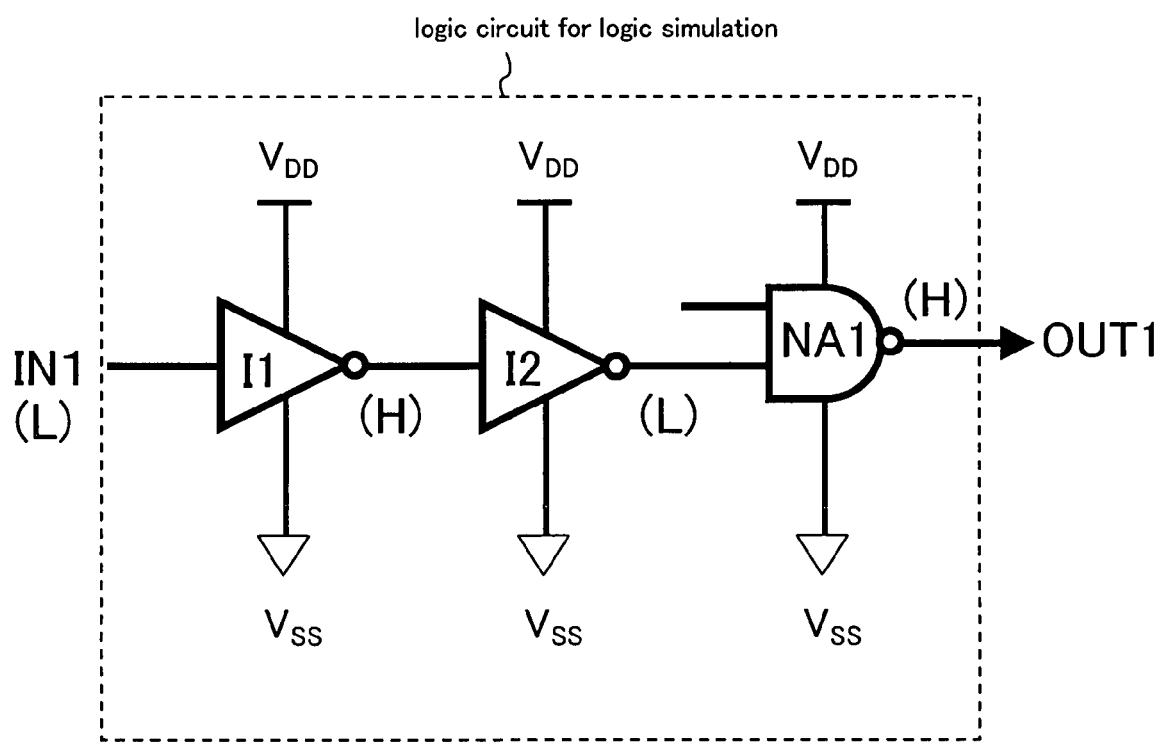
FIG. 4 is a circuit diagram showing an exemplary logic circuit represented by a net list.

FIG. 4 is a circuit diagram showing an example of the logic circuit represented by the net list 100. The logic circuit as shown in FIG. 4 is generated in the logic design stage. In FIG. 4, I1, I2, and NA1 are instance names assigned to primitive logic gates.

As shown in FIG. 4, in each primitive logic gate, the high-potential power supply end is connected to the high potential power supply line $V_{DD}$, and the low potential power supply end is connected to the low potential power supply line $V_{SS}$. Specifically, a net list obtained by logic design does not include information about which of the high-potential power supply end and the low potential power supply end of each primitive logic gate should be connected to the pseudo-power supply line.

Therefore, the net list 100 is used to perform logic simulation on the assumption of a state immediately before power cut-off. The logic simulation may be here performed using an existing logic simulator. Specifically, the logic simulation is performed while each input represented in the net list 100 is fixed to "H" (high level) or "L" (low level). Based on the result of the logic simulation, an output state of each primitive logic gate included in the logic circuit is determined.

For example, in the case of FIG. 4, the logic simulation is performed while an input end IN1 is, for example, fixed to "L". As a result, the output of the primitive logic gate 11 is "H", the output of the primitive logic gate 12 is "L", and the output of the primitive logic gate NA1 is "H".

Next, in a third step S13, the net list 100 is changed using the logic gate cells H and L based on the output states of each primitive logic gate determined in the second step S12. Specifically, the logic gate cell H is used for a primitive logic gate whose output state is "H", while the logic gate cell L is used for a primitive logic gate whose output state is "L", thereby updating the net list 100.

Figure 5:
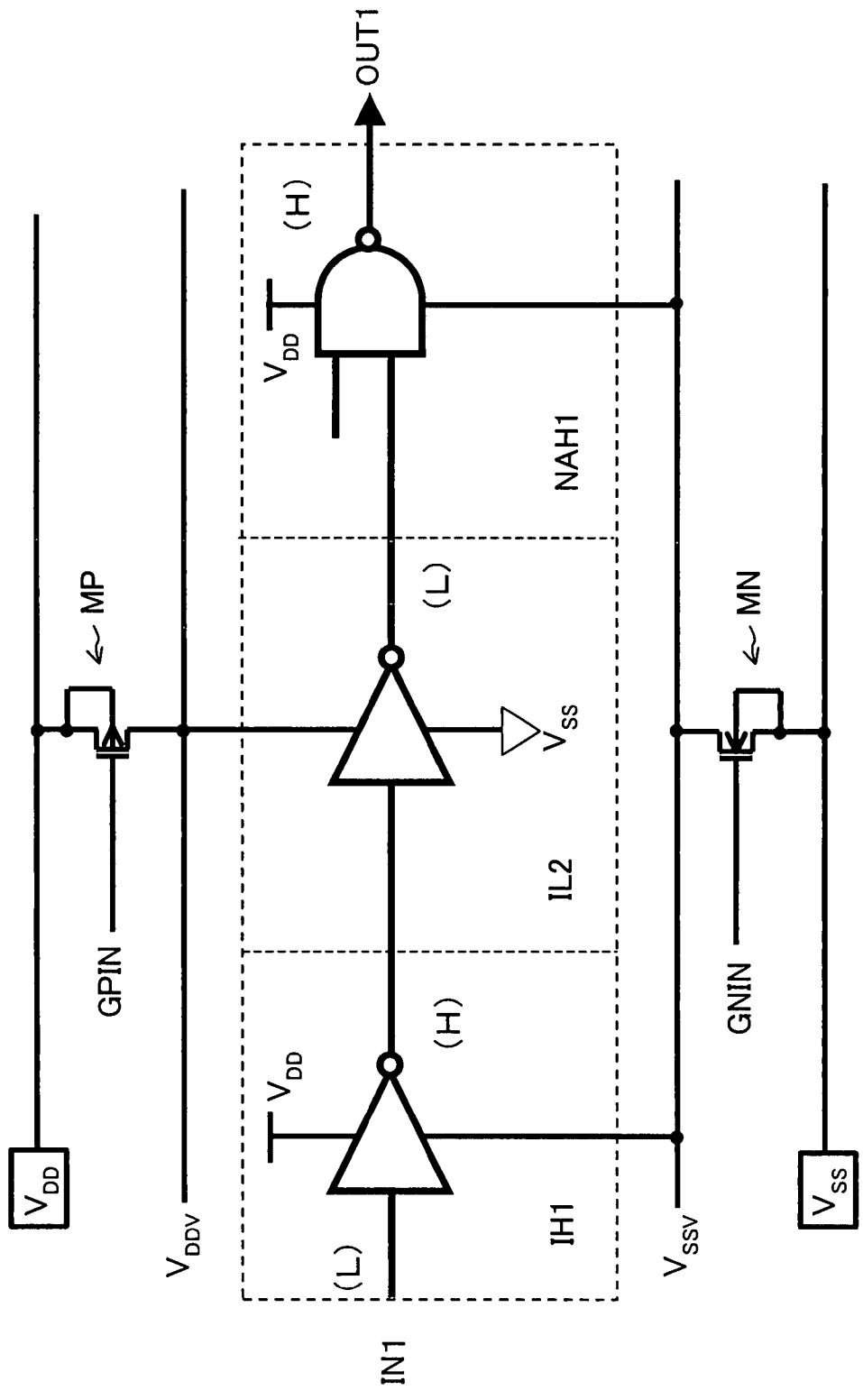
FIG. 5 is a circuit diagram showing the result of changing the logic circuit of FIG. 4.

As a result, for example, the logic circuit of FIG. 4 is changed to a logic circuit diagram of FIG. 5. In FIG. 5, the instances I1, I2 and NA1 are replaced with logic gate cells IH1, IL2 and NAH1, respectively. Further, a power control Pch MOS transistor MP is inserted between the high potential power supply line $V_{DD}$ and the first pseudo-power supply line $V_{DDV}$, and a power control Nch MOS transistor MN is inserted between the low potential power supply line $V_{SS}$ and the second pseudo-power supply line $V_{SSV}$.

In a fourth step S14, based on the net list changed in the third step S13, a layout is generated in which the layout cell H is used with respect to the logic gate cell H while the layout cell L is used with respect to the logic gate cell L.

Figure 6:
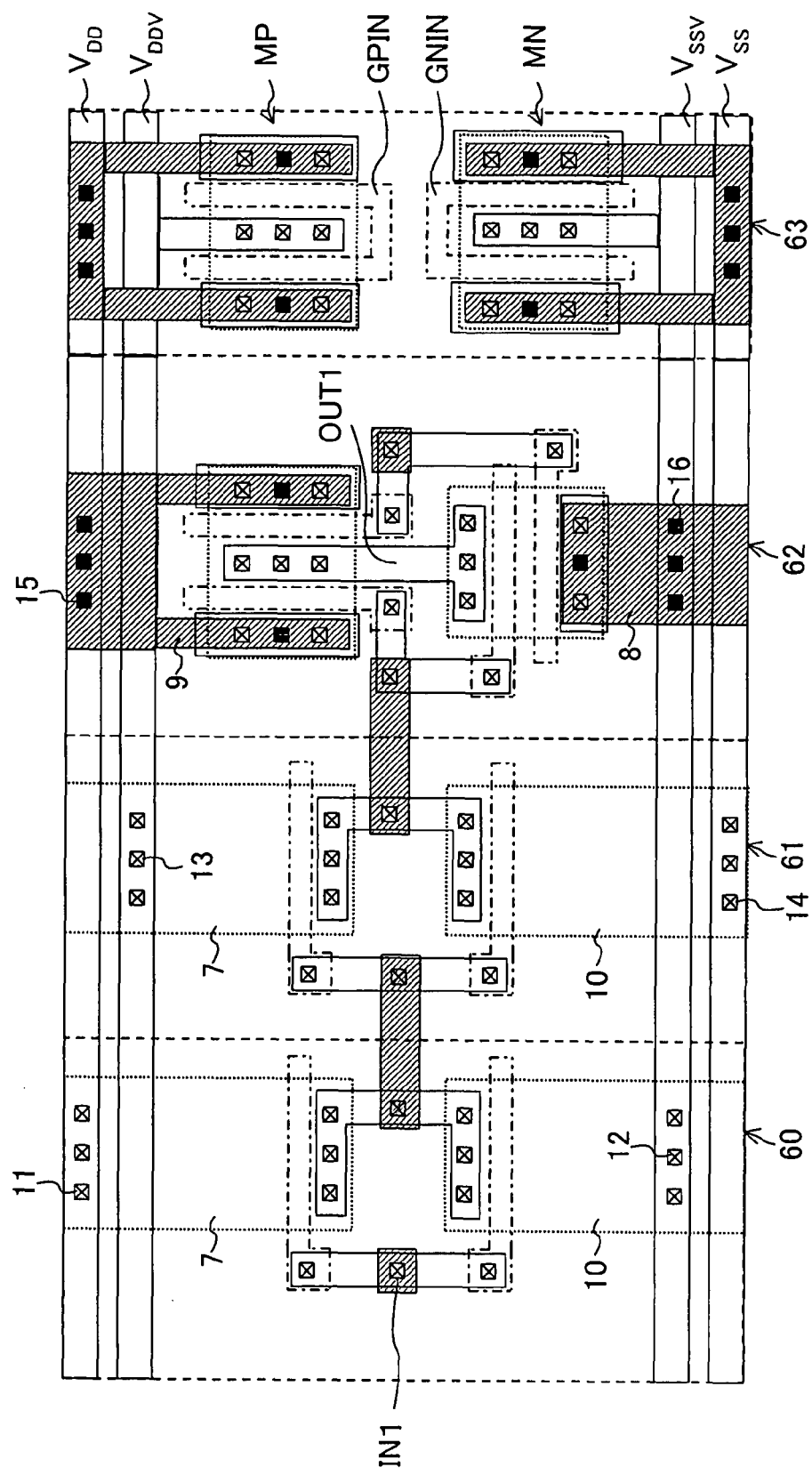
FIG. 6 is a diagram showing a layout generated from the logic circuit of FIG. 4.

For example, a layout as shown in FIG. 6 is generated from the net list as shown in FIG. 5. In FIGS. 6, 60, 61, and 62 indicate layout cells corresponding to the logic gate cells IH1, IL2 and NAH1, respectively. Also, 63 indicates a layout cell including the power control Pch MOS transistor MP and the power control Nch MOS transistor MN.

By using the semiconductor integrated circuit designing method of this embodiment, a semiconductor integrated circuit device having the layout as shown in FIG. 6 is obtained. This semiconductor integrated circuit device comprises the high potential power supply line $V_{DD}$, the low potential power supply line $V_{SS}$, the first pseudo-power supply line $V_{DDV}$ connected to the high potential power supply line $V_{DD}$ via the Pch MOS transistor MP as a first power control transistor, and the second pseudo-power supply line $V_{SSV}$ connected to the low potential power supply line $V_{SS}$ via the Nch MOS transistor MN as a second power control transistor. Further, the semiconductor integrated circuit device has the cells 60 and 61 as first and second cells which have transistor sections having a common layout. In the cell 60, the diffusion layer 7 extending from the high-potential power supply end is connected via the via 11 to the high potential power supply line $V_{DD}$, while the diffusion layer 10 extending from the low potential power supply end is connected via the via 12 to the second pseudo-power supply line $V_{SSV}$. In the cell 61, the diffusion layer 7 extending from the high-potential power supply end is connected via the via 13 to the first pseudo-power supply line $V_{DDV}$, while the diffusion layer 10 extending from the low potential power supply end is connected via the via 14 to the low potential power supply line $V_{SS}$.

Note that, when a layout cell (referred to as a cell A) corresponding to the logic gate cell NAL of FIG. 3B is included in the semiconductor integrated circuit device, the cell A and the cell 62 have transistor sections having a common layout. As shown in FIG. 6, in the cell 62, the metal wiring 9 extending from the high-potential power supply end is connected via the via 15 to the high potential power supply line $V_{DD}$, while the metal wiring 8 extending from the low potential power supply end is connected via the via 16 to the second pseudo-power supply line $V_{SSV}$. On the other hand, as shown in FIG. 3B, in the cell A, the metal wiring 9 extending from the high-potential power supply end is connected via the via 17 to the first pseudo-power supply line $V_{DDV}$, while the metal wiring 8 extending from the low potential power supply end is connected the via 18 to the low potential power supply line $V_{SS}$.

As described above, according to this embodiment, semiconductor integrated circuits having the ZSCCMOS structure can be easily designed by changing a net list using logic gate cells H and L based on the result of logic simulation, and providing layout cells H and L corresponding to the logic gate cells H and L. Therefore, automatic layout design can be achieved and the number of steps in design can be significantly reduced.

In the example described above, primitive logic gates are used. General logic gates, such as a buffer, an AND, an OR and the like, other than primitive logic gates can be basically formed of a combination of primitive logic gates. For example, a buffer is formed of two inverters, an AND is formed of a NAND and an inverter, and an OR is formed of a NOR and an inverter.

Figure 7:
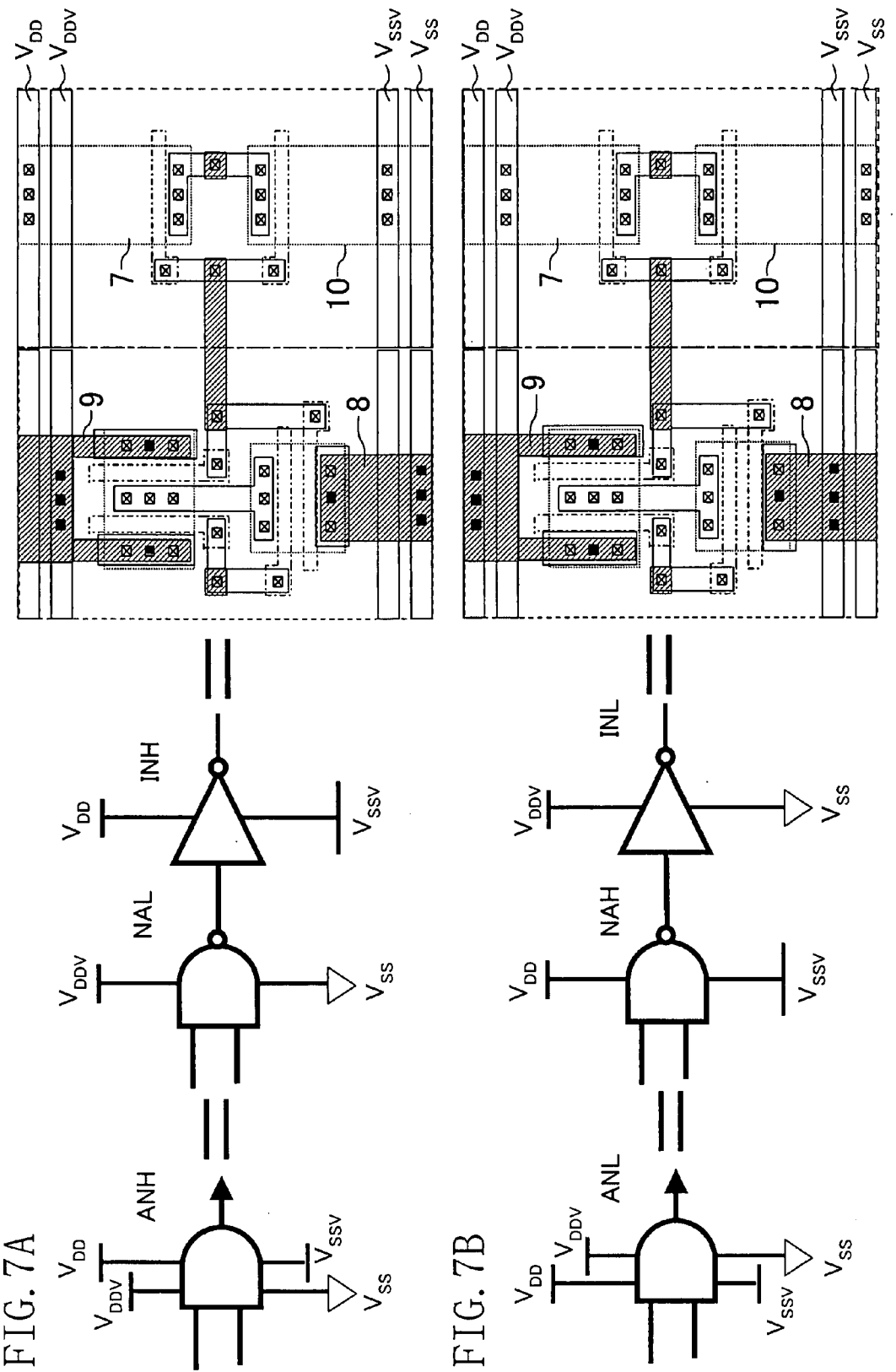
FIGS. 7A and 7B are diagrams showing an example of logic gate cells and layout cells for an AND gate.

FIGS. 7A and 7B show exemplary AND gates. FIG. 7A shows a logic gate cell (ANH) and a layout cell which are used in an AND gate whose output state is "H", and FIG. 7B shows a logic gate cell (ANL) and a layout cell which are used in an AND gate whose output state is "L".

As shown in FIG. 7A, the logic gate cell ANH is formed of a combination of a logic gate cell NAL (a logic gate cell L which is a NAND gate) and a logic gate cell INH (a logic gate cell H which is an inverter). On the other hand, as shown in FIG. 7B, the logic gate cell ANL is formed of a combination of a logic gate cell NAH (a logic gate cell H which is a NAND gate) and a logic gate cell INL (a logic gate cell L which is an inverter).

Embodiment 2

Figure 8:
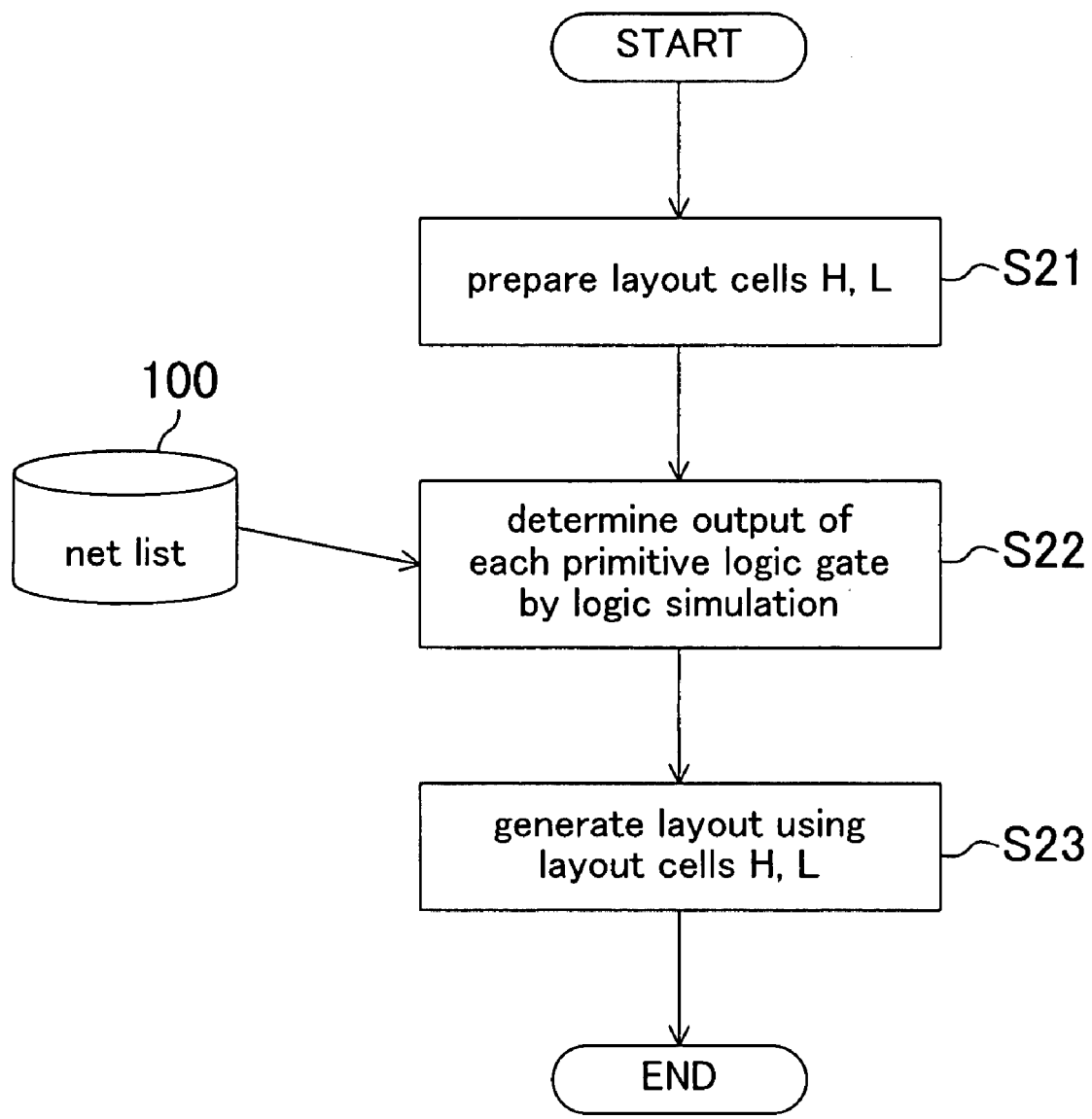
FIG. 8 is a flowchart showing a semiconductor integrated circuit designing method according to Embodiment 2 of the present invention.

FIG. 8 is a flowchart showing a semiconductor integrated circuit designing method according to Embodiment 2 of the present invention. The semiconductor integrated circuit designing method of this embodiment will be described with reference to FIG. 8.

Initially, in a first step S21, for each kind of primitive logic gate, two kinds of layout cells, i.e., a layout cell H as a first layout cell and a layout cell L as a second layout cell, are prepared. The layout cells H and L are, for example, stored in a database.

In the layout cell H, the high-potential power supply end of the primitive logic gate is connected to a high potential power supply line $V_{DD}$, and the low potential power supply end is connected to a second pseudo-power supply line $V_{SSV}$ connected via a power control transistor to a low potential power supply line $V_{SS}$. On the other hand, in the layout cell L, the high-potential power supply end is connected to a first pseudo-power supply line $V_{DDV}$ connected via a power control transistor to the high potential power supply line $V_{DD}$, and the low potential power supply end is connected to the low potential power supply line $V_{SS}$. Examples of the layout cells H and L are as shown in FIGS. 2 and 3.

Next, in a second step S22, logic simulation is performed on the assumption of a state immediately before power cut-off using the net list 100 representing a logic circuit to be designed. Based on the result of the simulation, an output state of each primitive logic gate included in the logic circuit represented by the net list 100 is determined. Step S22 is similar to step S12 of Embodiment 1.

In a third step S23, based on the output state of each primitive logic gate determined in the second step S22, a layout is generated from the net list 100. Specifically, the layout cell H is used for a primitive logic gate whose output state is "H", while the layout cell L is used for a primitive logic gate whose output state is "L", thereby generating a layout. As a result, for example, the layout as shown in FIG. 6 is generated from the logic circuit as shown in FIG. 4.

As described above, according to this embodiment, a semiconductor integrated circuit having the ZSCCMOS structure can be easily designed by providing the layout cells H and L corresponding to primitive logic gates based on the result of logic simulation. Therefore, automatic layout design can be achieved and the number of steps in design can be significantly reduced.

Embodiment 3

Embodiment 3 of the present invention is similar to Embodiments 1 and 2 in the basic process flow. Note that Embodiment 3 is different from Embodiments 1 and 2 in that at least a portion of layout cells H and L includes a power control transistor.

Figures 9A, 9B:
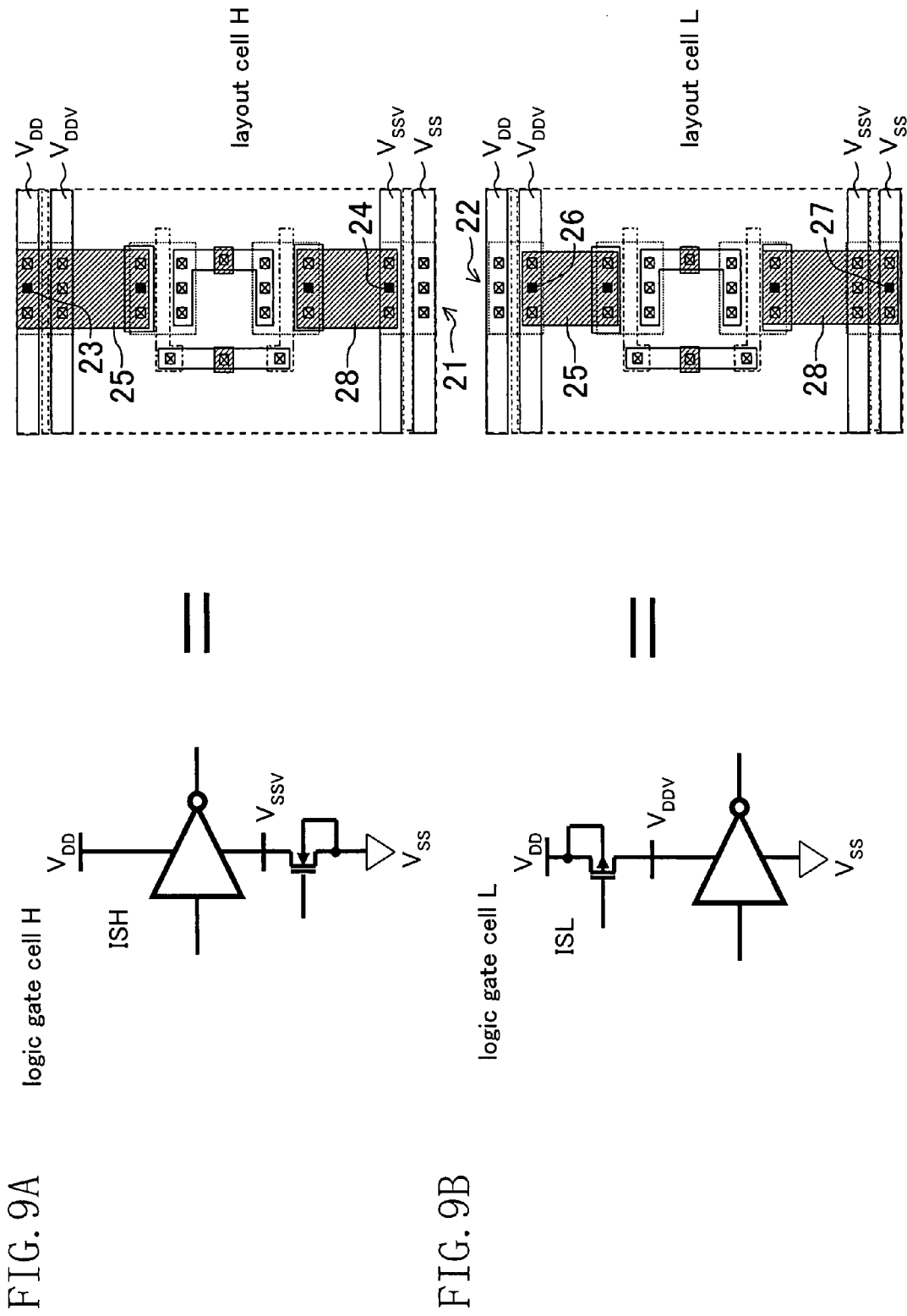
FIGS. 9A and 9B are diagrams showing an example of logic gate cells H and L and layout cells H and L according to Embodiment 3 of the present invention.

FIGS. 9A and 9B are diagrams showing an example of logic gate cells H and L and layout cells H and L according to this embodiment, where an inverter is used as the primitive logic gate. FIG. 9A shows the logic gate cell H and the layout cell H, and FIG. 9B shows the logic gate cell L and the layout cell L.

As shown in FIG. 9A, in the logic gate cell H, the high-potential power supply end is connected to a high potential power supply line $V_{DD}$, and the low potential power supply end is connected to a second pseudo-power supply line $V_{SSV}$. Also, a power control transistor is provided between a low potential power supply line $V_{SS}$ and a second pseudo-power supply line $V_{SSV}$. In the layout cell H, a metal wiring 25 extending from the high-potential power supply end is connected via a via 23 to the high potential power supply line $V_{DD}$, and a metal wiring 28 extending from the low potential power supply end is connected via a via 24 to the second pseudo-power supply line $V_{SSV}$. Also, a power control transistor 21 is provided between the low potential power supply line $V_{SS}$ and the second pseudo-power supply line $V_{SSV}$.

As shown in FIG. 9B, in the logic gate cell L, the high-potential power supply end is connected to the first pseudo-power supply line $V_{DDV}$, and the low potential power supply end is connected to the low potential power supply line $V_{SS}$. Also, a power control transistor is provided between the high potential power supply line $V_{DD}$ and the first pseudo-power supply line $V_{DDV}$. In the layout cell L, the metal wiring 25 extending from the high-potential power supply end is connected via a via 26 to the first pseudo-power supply line $V_{DDV}$, and the metal wiring 28 extending from the low potential power supply end is connected via a via 27 to the low potential power supply line $V_{SS}$. Also, a power control transistor 22 is provided between the high potential power supply line $V_{DD}$ and the first pseudo-power supply line $V_{DDV}$.

Note that, for example, for a NAND gate, it is easy to prepare logic gate cells H and L and layout cells H and L similar to those of the inverter of FIG. 9, though they are not here illustrated.

Figure 10:
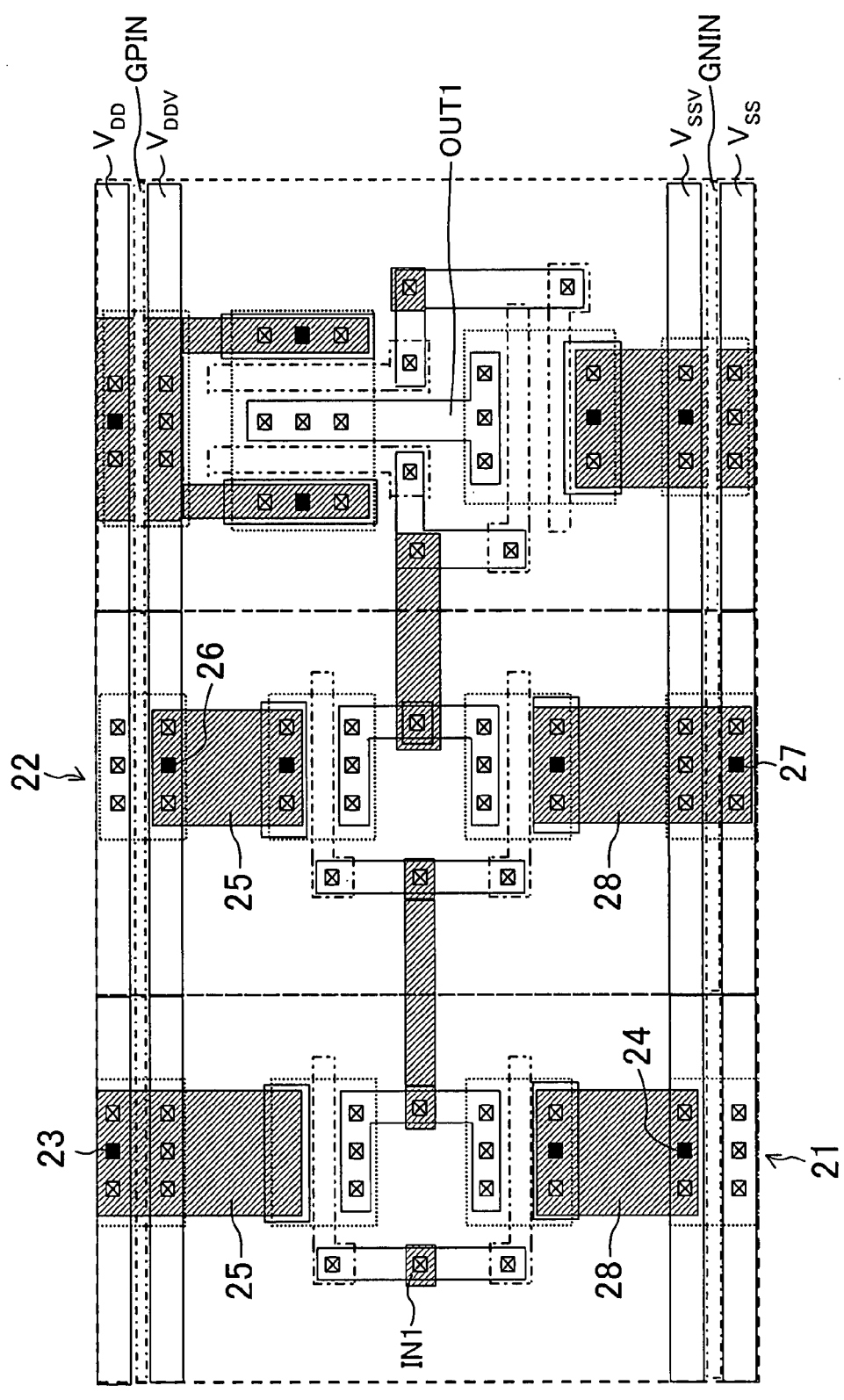
FIG. 10 is a diagram showing an exemplary layout obtained by Embodiment 3 of the present invention.

FIG. 10 shows an exemplary layout obtained from the logic circuit of FIG. 4 by this embodiment. As shown in FIG. 10, the leftmost cell has the power control transistor 21 provided between the low potential power supply line $V_{SS}$ and the second pseudo-power supply line $V_{SSV}$, and the middle cell has the power control transistor 22 provided between the high potential power supply line $V_{DD}$ and the first pseudo-power supply line $V_{DDV}$.

As described above, according to this embodiment, it is easy to design a semiconductor integrated circuit device having the ZSCCMOS structure. Also, by using a layout cell including a power control transistor, the layout area can be reduced.

Embodiment 4

Embodiment 4 of the present invention has a basic process flow similar to those of Embodiments 1 and 2. Note that Embodiment 4 is different from Embodiments 1 and 2 in that, in the layout cells H and L, the high potential power supply line $V_{DD}$ and the first pseudo-power supply line $V_{DDV}$ overlap each other, and the low potential power supply line $V_{SS}$ and the second pseudo-power supply line $V_{SSV}$ overlap each other.

FIGS. 11A and 11B are diagrams an example of logic gate cells H and L and layout cells H and L according to this embodiment, where an inverter is used as the primitive logic gate. FIG. 11A shows the logic gate cell H and the layout cell H, and FIG. 11B shows the logic gate cell L and the layout cell L.

As shown in FIGS. 11A and 11B, in the layout cells H and L, first and second pseudo-power supply lines $V_{DDV}$ and $V_{SSV}$ are formed in a first metal wiring layer, and a high potential power supply line $V_{DD}$ and a low potential power supply line $V_{SS}$ are formed in a second metal wiring layer. The high potential power supply line $V_{DD}$ and the first pseudo-power supply line $V_{DDV}$ overlap each other, and the low potential power supply line $V_{SS}$ and the second pseudo-power supply line $V_{SSV}$ overlap each other. In the layout cell H, the high-potential power supply end is connected via a metal wiring 31 in the second metal wiring layer to the high potential power supply line $V_{DD}$, while the low potential power supply end is connected via a metal wiring 32 in the first metal wiring layer to the second pseudo-power supply line $V_{SSV}$. In the layout cell L, the high-potential power supply end is connected via a metal wiring 33 in the first metal wiring layer to the first pseudo-power supply line $V_{DDV}$, while the low potential power supply end is connected via a metal wiring 34 in the second metal wiring layer to the low potential power supply line $V_{SSV}$.

Note that it is easy to prepare layout cells H and L for, for example, a NAND gate as is similar to the inverter of FIG. 11, though they are not here illustrated.

Figure 12:
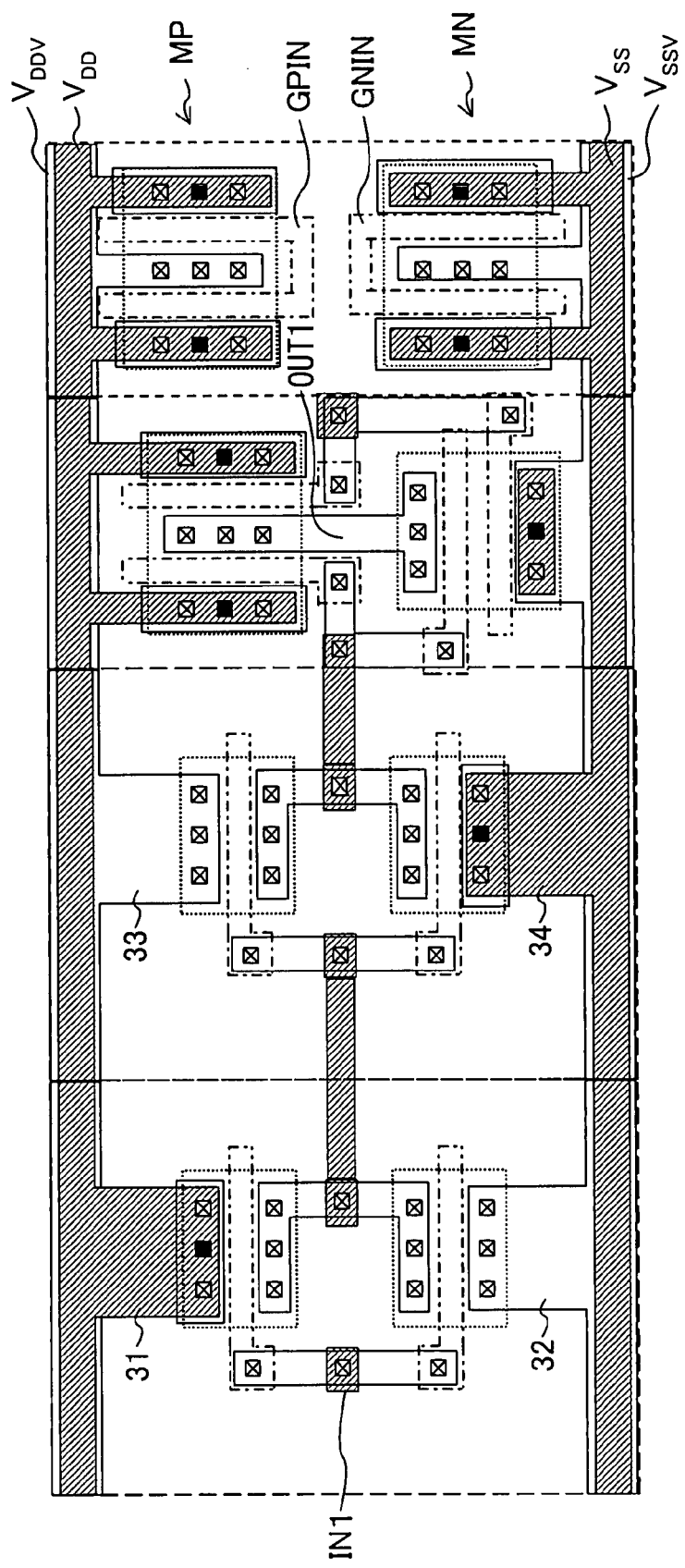
FIG. 12 is a diagram showing an exemplary layout according to Embodiment 4 of the present invention.

FIG. 12 shows an exemplary layout obtained from the logic circuit of FIG. 4 by this embodiment. As shown in FIG. 12, the high potential power supply line $V_{DD}$ and the first pseudo-power supply line $V_{DDV}$ overlap each other, and the low potential power supply line $V_{SS}$ and the second pseudo-power supply line $V_{SSV}$ overlap each other.

As described above, according to this embodiment, semiconductor integrated circuit devices having the ZSCCMOS structure can be easily designed. Also, by using a layout cell in which a high potential power supply line and a first pseudo-power supply line overlap each other and a low potential power supply line and a second pseudo-power supply line overlap each other, the layout are can be further reduced.

Embodiment 5

Figure 13:
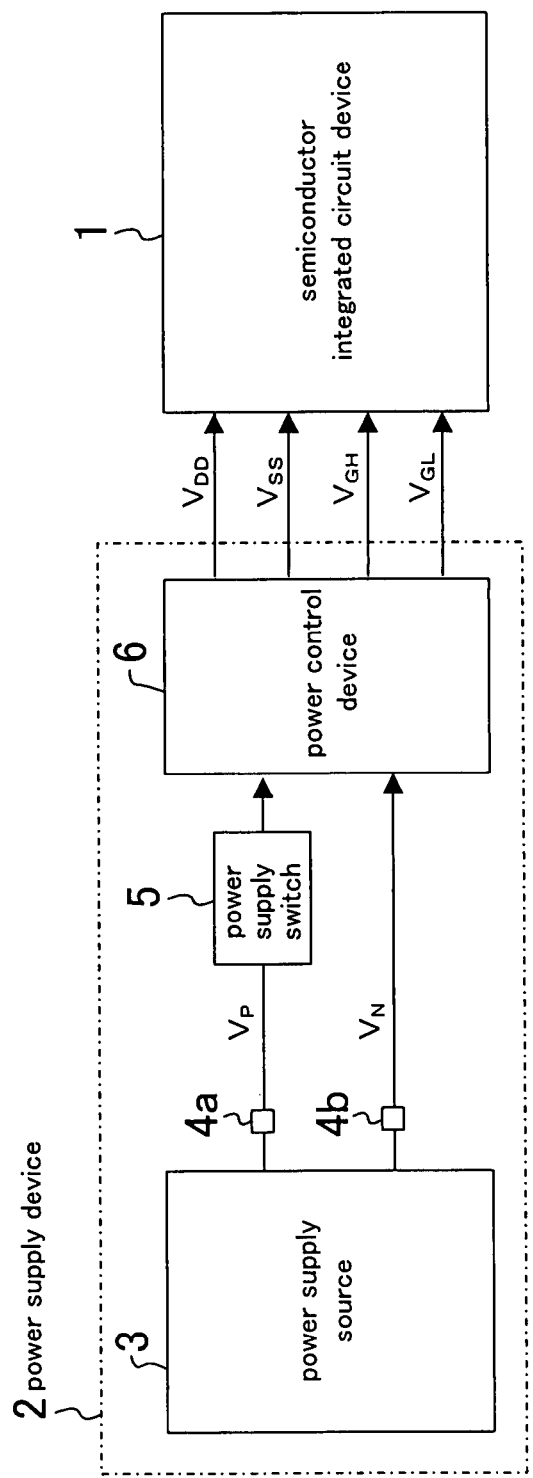
FIG. 13 is a block diagram showing a configuration of an electronic device according to Embodiment 5 of the present invention.
Figure 14:
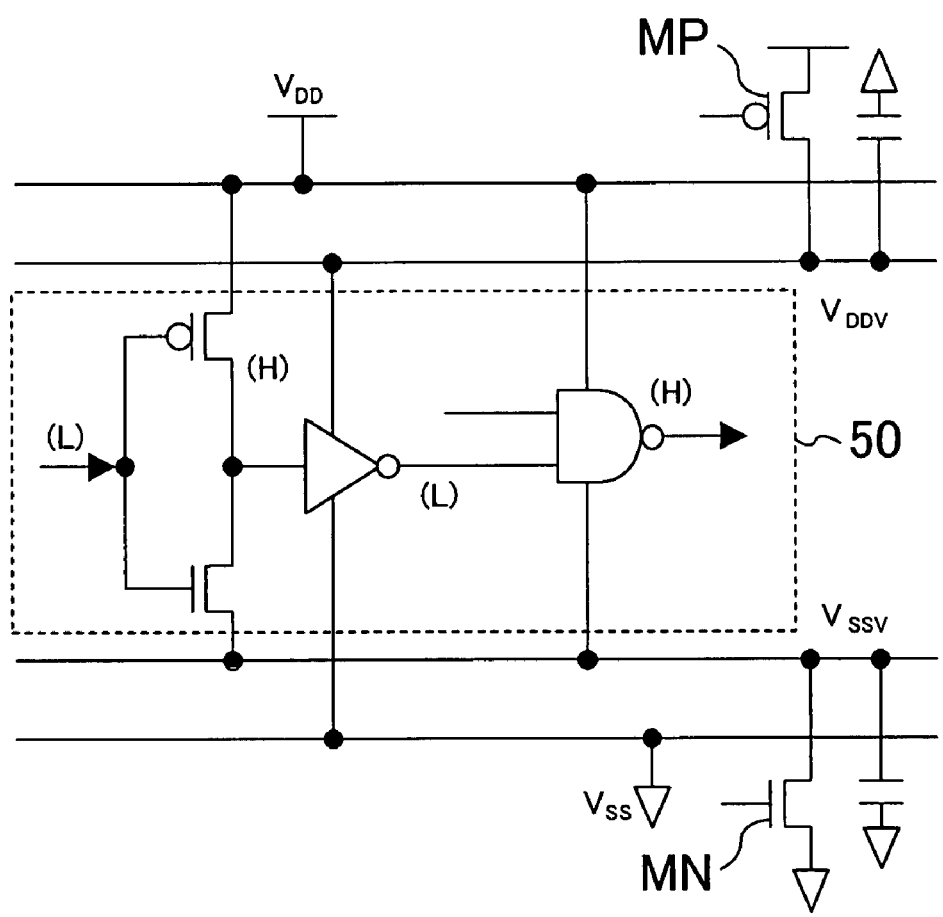
FIG. 14 is a circuit diagram showing the configuration of a ZSCCMOS circuit.

FIG. 13 is a block diagram showing a configuration of an electronic device according to Embodiment 5 of the present invention. In FIG. 13, the electronic device comprises a semiconductor integrated circuit device 1 and a power supply device 2 which supplies power to the semiconductor integrated circuit device 1. As the semiconductor integrated circuit device 1, any of the semiconductor integrated circuit devices of Embodiments 1 to 4 is applicable. As the electronic device, specifically, a mobile telephone, a DVD decoder, or the like is contemplated.

The power supply device 2 comprises a power supply source 3 (e.g., a battery, an AC-DC converter, etc.), power supply input terminals 4a and 4b which receive a power supply voltage generated by the power supply source 3, a power supply switch 5 which turns ON/OFF a power supply voltage, and a voltage control device 6 which receives a power supply voltage of the power supply source 3 to generate and supply a voltage required by the semiconductor integrated circuit device 1. Note that, $V_{GH}$ and $V_{GL}$ are an upper-limit voltage and a lower-limit voltage of a control voltage which is supplied to the gate of a power control transistor.

An electronic device which employs a battery as the power supply source 3 is considerably effective as a portable device which can be driven for a long time. Also, the power saving effect can be sufficiently expected for an electronic device which employs an AC-DC converter as the power supply source 3.

Note that the above descriptions are only for the purpose of illustrating preferred embodiments of the present invention. The present invention is not limited to the above descriptions.

Also, although the term "semiconductor integrated circuit device" is herein used for the sake of convenience, other terms such as "semiconductor integrated circuit", "logic circuit" and the like may be used.

Note that, in order to reduce the ON resistance of the power control transistor, the absolute value of the threshold voltage of the power control transistor may be smaller than or equal to the absolute value of the threshold voltage of a transistor included in the logic circuit. Alternatively, the power control transistor may be of the depletion type. Note that the gate voltage of the Nch transistor may be set to be $V_{SS}$ or less and the gate voltage of the Pch transistor may be set to be $V_{DD}$ or more, thereby making it possible to reduce cut-off leakage to a sufficiently small level.

Further, the present invention is applicable to not only semiconductor integrated circuits composed of typical MOS transistors formed on a silicon substrate, but also semiconductor integrated circuits composed of MOS transistors having the SOI (Silicon On Insulator) structure.

For example, the power supply control Nch MOS transistor and the power supply control Pch MOS transistor may be formed on a silicon substrate having the SOI structure. Thereby, latchup is advantageously prevented. Further, transistors in each layout cell may be formed on a silicon substrate having the SOI structure.

By employing the design method of the present invention, ZSCCMOS circuits can be automatically designed, thereby making it possible to significantly reduce the number of steps in design. Therefore, the present invention effectively facilitates production of semiconductor integrated circuits having low power consumption.

What is claimed is:

1. A method for designing a semiconductor integrated circuit having a zigzag super cut-off CMOS structure, the semiconductor integrated circuit comprising a high potential power supply line, a low potential power supply line, a first pseudo-power supply line connected to the high potential power supply line via a first power control transistor, and a second pseudo-power supply line connected to the low potential power supply line via a second power control transistor, the method comprising:

a first step of preparing a first logic gate cell and a first layout cell each having a high potential power supply end connected to the high potential power supply line and a low potential power supply end connected to the second pseudo-power supply line, and a second logic gate cell and a second layout cell each having a high potential power supply end connected to the first pseudo-power supply line and a low potential power supply end connected to the low potential power supply line, for each kind of primitive logic gate, the high potential power supply end of the second logic gate and the second layout cell and the low potential power supply end of the first logic gate cell and the first layout cell being source or drain of transistors in the primitive logic gate;

a second step of performing logic simulation, by using a simulator, on an assumption of a state immediately before power cut-off using a net list representing a logic circuit to be designed, and based on a result of the simulation, determining an output state of each primitive logic gate included in the logic circuit;

a third step of changing the net list by using a first logic gate cell for a primitive logic gate having an output state of "H" and a second logic gate cell for a primitive logic gate having an output state of "L" based on the output state of each primitive logic gate determined in the second step; and a fourth step of generating a layout by using the first layout cell for the first logic gate cell and the second layout cell for the second logic gate cell based on the net list changed in the third step.

2. The method of claim 1, wherein
in the second step, the logic simulation is performed while each input to the logic circuit is fixed to "H" or "L".

3. The method of claim 1, wherein
the first and second layout cells of the same kind of primitive logic gates have a common layout of a transistor section,
in the first layout cell, a diffusion layer or a metal wiring extending from the high potential power supply end is connected via a via to the high potential power supply line, while a diffusion layer or a metal wiring extending from the low potential power supply end is connected via a via to the second pseudo-power supply line, and
in the second layout cell, a diffusion layer or a metal wiring extending from the high potential power supply end is connected via a via to the first pseudo-power supply line, while a diffusion layer or a metal wiring extending from the low potential power supply end is connected via a via to the low potential power supply line.

4. The method of claim 1, wherein
at least one first layout cell includes a power control transistor provided between the second pseudo-power supply line and the low potential power supply line, and
at least one second layout cell includes a power control transistor provided between the first pseudo-power supply line and the high potential power supply line.

5. The method of claim 1, wherein
in each of the first and second layout cells, the high potential power supply line and the first pseudo-power supply line overlap each other, and the low potential power supply line and the second pseudo-power supply line overlap each other.

6. A method for designing a semiconductor integrated circuit having a zigzag super cut-off CMOS structure, the semiconductor integrated circuit comprising a high potential power supply line, a low potential power supply line, a first pseudo-power supply line connected to the high potential power supply line via a first power control transistor, and a second pseudo-power supply line connected to the low potential power supply line via a second power control transistor, the method comprising:

a first step of preparing a first layout cell having a high potential power supply end connected to the high potential power supply line and a low potential power supply end connected to the second pseudo-power supply line, and a second layout cell having a high potential power supply end connected to the first pseudo-power supply line and a low potential power supply end connected to the low potential power supply line, for each kind of primitive logic gate, the high potential power supply end of the second layout cell and the low potential power supply end of the first layout cell being source or drain of transistors in the primitive logic gate;

a second step of performing logic simulation, by using a simulator, on an assumption of a state immediately before power cut-off using a net list representing a logic circuit to be designed, and based on a result of the simulation, determining an output state of each primitive logic gate included in the logic circuit; and a third step of generating a layout by using the first layout cell for a primitive logic cell having an output state of "H" and the second layout cell for a primitive logic cell having an output state of "L" based on the output state of each primitive logic gate determined in the second step.

7. The method of claim 6, wherein
in the second step, the logic simulation is performed while each input to the logic circuit is fixed to "H" or "L".

8. The method of claim 6, wherein
the first and second layout cells of the same kind of primitive logic gates have a common layout of a transistor section,
in the first layout cell, a diffusion layer or a metal wiring extending from the high potential power supply end is connected via a via to the high potential power supply line, while a diffusion layer or a metal wiring extending from the low potential power supply end is connected via a via to the second pseudo-power supply line, and
in the second layout cell, a diffusion layer or a metal wiring extending from the high potential power supply end is connected via a via to the first pseudo-power supply line, while a diffusion layer or a metal wiring extending from the low potential power supply end is connected via a via to the low potential power supply line.

9. The method of claim 6, wherein
at least one first layout cell includes a power control transistor provided between the second pseudo-power supply line and the low potential power supply line, and
at least one second layout cell includes a power control transistor provided between the first pseudo-power supply line and the high potential power supply line.

10. The method of claim 6, wherein
in each of the first and second layout cells, the high potential power supply line and the first pseudo-power supply line overlap each other, and the low potential power supply line and the second pseudo-power supply line overlap each other.

11. A semiconductor integrated circuit device having a zigzag super cut-off CMOS structure, the semiconductor integrated circuit comprising:

a high potential power supply line and a low potential power supply line;

a first pseudo-power supply line connected to the high potential power supply line via a first power control transistor;

a second pseudo-power supply line connected to the low potential power supply line via a second power control transistor; and a first cell and a second cell having a transistor section having a common layout, wherein in the first cell, a diffusion layer or a metal wiring extending from a high potential power supply end thereof is connected via a via to the high potential power supply line, while a diffusion layer or a metal wiring extending from a low potential power supply end thereof, which is source or drain of transistors, is connected via a via to the second pseudo-power supply line, and in the second cell, a diffusion layer or a metal wiring extending from a high potential power supply end thereof, which is source or drain of transistors, is connected via a via to the first pseudo-power supply line, while a diffusion layer or a metal wiring extending from a low potential power supply end thereof is connected via a via to the low potential power supply line.

12. The device of claim 11, wherein the first cell has a power control transistor provided between the second pseudo-power supply line and the low potential power supply line, and the second cell has a power control transistor provided between the first pseudo-power supply line and the high potential power supply line.

13. The device of claim 11, wherein the high potential power supply line and the first pseudo-power supply line overlap each other, and the low potential power supply line and the second pseudo-power supply line overlap each other.

14. The device of claim 11, wherein the first and second power control transistors have a threshold voltage whose absolute value is smaller than or equal to the absolute value of a threshold voltage of a transistor included in the first and second cells.

15. The device of claim 11, wherein the first and second power control transistors are of the depletion type.

16. The device of claim 11, wherein the first and second power control transistors are formed on a silicon substrate having the SOI (Silicon on Insulator) structure.

17. The device of claim 11, wherein each transistor included in the first and second cells is formed on a silicon substrate having the SOI (Silicon on Insulator) structure.

18. An electronic device comprising:

the semiconductor integrated circuit device of claim 11; and a power supply device for supplying power to the semiconductor integrated circuit device.

\* \* \* \* \*